United States Patent [19]

Coffin

[11] 3,834,605

[45] Sept. 10, 1974

[54] PRINTED CIRCUIT CARD COMPONENT REMOVAL APPARATUS

[75] Inventor: Harry S. Coffin, King of Prussia, Pa.

[73] Assignee: Control Valve Corporation, Minneapolis, Minn.

[22] Filed: Jan. 15, 1973

[21] Appl. No.: 323,558

[52] U.S. Cl. .................................... 228/20, 29/427
[51] Int. Cl. ............................................... B23k 1/00
[58] Field of Search .......... 228/19, 20; 29/426, 427; 269/21; 248/362, 363

[56] References Cited

UNITED STATES PATENTS

| | | | |
|---|---|---|---|
| 2,602,180 | 7/1952 | Miller | 228/20 UX |
| 3,045,095 | 7/1962 | Usher et al. | 228/20 X |
| 3,169,499 | 2/1965 | Armanno | 228/20 |
| 3,652,075 | 3/1972 | Thompson | 269/21 |
| 3,746,239 | 7/1973 | Auray | 228/19 |

FOREIGN PATENTS OR APPLICATIONS

| | | | |
|---|---|---|---|
| 1,361,614 | 4/1964 | France | 248/362 |

*Primary Examiner*—J. Spencer Overholser
*Assistant Examiner*—Robert J. Craig
*Attorney, Agent, or Firm*—Edward L. Schwarz

[57] ABSTRACT

Apparatus for removing a component whose leads pass through and are soldered into holes in a printed circuit board. The solder gripping the leads is melted, and the apparatus then applies a vacuum to the component side of the board to remove the component.

7 Claims, 2 Drawing Figures

PRINTED CIRCUIT CARD COMPONENT REMOVAL APPARATUS

BACKGROUND OF THE INVENTION

1. Field of the Invention

Desoldering tools perform the same function as this invention. So called "solder suckers" are also a related device. More generally, this invention fits into the category of methods and tools involved in fabrication and repair of those printed circuits having holes extending completely through the board itself into which each component lead is fixed by surface soldering of each lead to a printed conductor.

2. Description of the Prior Art

The previously mentioned desoldering tools range upward in complexity from a very simple shaft having a pair of tines at one end adapted to hold the wire to be removed, and work it loose from the printed circuit, solder lug or terminal strip while heat is being applied to melt the solder. More elaborate devices combine the heat source with the tines or jaws which grip and hold the wire, and may further include a vacuum source which removes the solder from the joint as it is melted. Solder suckers are used to remove either molten or loose solid solder present in the chassis or on the printed circuit board. In large-scale component removal from printed circuit boards having holes passing through them in which the leads are soldered, the usual procedure is to merely grasp the component body with a pliers, melt the solder holding the leads, and then simply remove the component. These operations all suffer from one or more defects. Coordination of operations on two sides of an opaque board require significant manual dexterity. Even when using a vacuum solder remover, the solder cannot be removed uniformly due to variations in the manual operations. Thus, solder may remain in the hole in the circuit board interfering with the later replacement of the component. I know of no method or apparatus (other than the invention to be described) which can so quickly and effectively remove one or a plurality of such soldered-in wires or components.

BRIEF DESCRIPTION OF THE INVENTION

The component remover apparatus comprises a vessel having a cavity with an upwardly facing opening. The vessel is shaped so as to permit the printed circuit board to lie in a preferred position with the components to be removed within the opening. The components when the board is in position must be beneath the board with the lead ends projecting upwardly and the solder sufficiently exposed to permit its being melted from the upwardly facing surface. A seal or gasket is placed in a position contacting both the surface of the vessel adjacent the entire periphery of the opening and the printed circuit board, and is compressed by some means so as to form an airtight contact between the board and the cavity within the vessel. The vessel also has a vacuum inlet at a convenient point which pierces the cavity and extends through the vessel to the outside. A vacuum source, which may be, for example, a vacuum pump or an aspirator, is connected to the vacuum inlet through a valve and suitable hoses or pipes. In operation, a soldering gun, an alcohol torch, or any point source of heat is applied to each lead of the component to be removed, or to the wire itself if a single wire is to be removed, to melt the solder which attaches the lead(s) to the printed circuitry. When the solder for each lead of the component is melted, the vacuum valve is opened, allowing the air within the cavity to rush outward. The force generated by the outside atmosphere pressing upon the leads and molten solder, though small, is sufficient to drive the leads out of the holes in which they were originally placed, thereby freeing the components to fall into the cavity. Surprisingly, it is not necessary to plug these holes in any fashion before removing another component by performing these same steps. In fact, as many as 50 components, each having at least two leads, may be removed from a single circuit board without performance being noticeably degraded.

This apparatus will not operate if the component leads have been clinched or bent over in such a manner as to contact the periphery or inner surface of the lead holes, because the atmospheric force is not sufficient to overcome this additional resistance. Normally, however, printed circuit boards are fabricated without this additional step because the mechanical strength of the solder is more than sufficient to firmly hold the components in place, and therefore, the additional expense of a lead bending or crimping operation is unnecessary. As each lead is driven from the lead hole, the solder surrounding it is invariably expelled as well, leaving the circuit board lead holes in perfect condition for replacement of the removed component.

Accordingly, one purpose of this invention is to increase the speed of removal of components in printed circuit boards.

A second purpose is to provide a more uniform lead hole after component removal for easier and more reliable replacement of the component.

A third object of this invention is to reduce damage to the removed components for later testing or for reusage.

Other objects of this invention will become apparent from the detailed description of the drawings.

DETAILED DESCRIPTION OF THE EMBODIMENTS

Figure 1:
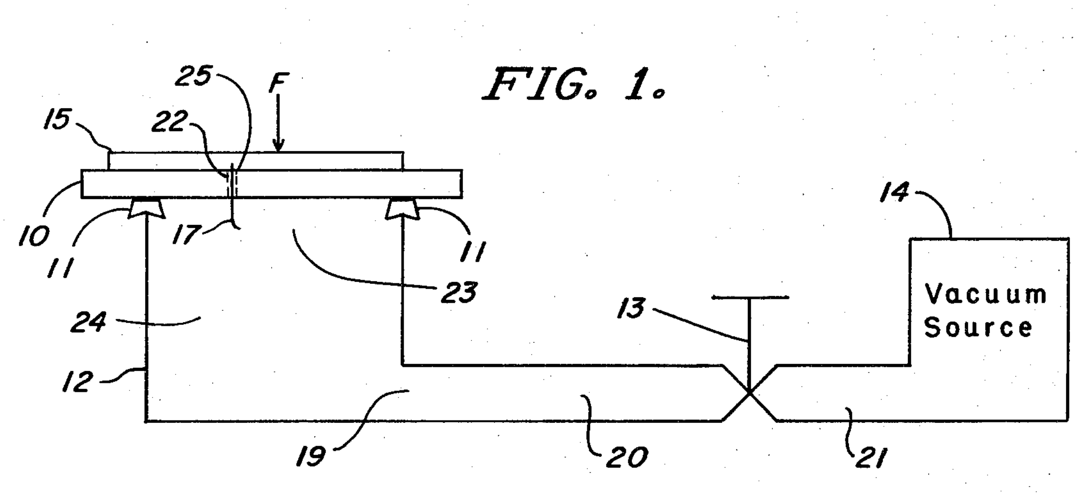
FIG. 1 discloses a simple embodiment of the invention employing a first version of the seal between the circuit board and the vessel.

Referring first to FIG. 1, therein is displayed a vessel 12 having an upwardly facing opening generally indicated by reference numeral 23, and a vacuum inlet 19. Airtight conduits 20 and 21, which may be hoses or pipes, connect vacuum inlet 19 to valve 13 and valve 13 to vacuum source 14, respectively. Opening 23 in cavity 24 may be of any convenient size and shape so as to be completely covered by printed circuit board 10 when the circuit board is placed in a selected position upon the opening. Gasket 11 is interposed between the periphery of opening 23 and printed circuit board 10. Annular bracket or collar 15 may have a shape roughly corresponding to the shape of the surface of vessel opening 23. Force F, indicated by the downwardly pointing arrow, may comprise any means for forcing collar 15 firmly against printed circuit board 10, to form a reasonably airtight seal around the periphery of opening 23. This force may be supplied by clamps or may be the intrinsic weight of collar 15 itself. In certain cases, the weight of circuit board 10 may be sufficient to form the necessary seal, and collar 15 may be omitted completely. Circuit board 10 should be oriented so that the shorter, straight portion of lead 17, the portion held by solder 25 within hole 22, is projecting upwardly. Vacuum source 14 may have any convenient pressure gradient greater than a few psi, but preferably is around 5 psi. Greater vacuum will allow satisfactory operation, as long as circuit board 10 is not damaged, but is more expensive and unnecessary for proper performance of the apparatus. Vacuum source 14 should have sufficient vacuum generating capacity to rapidly exhaust cavity 24. To further this aim, it is also advisable that conduits 20 and 21 and valve 13 have sufficiently large cross section areas to provide little resistance to rapid flow of air through them.

In operation, circuit board 10 is placed over and completely covers openings 23 with the longer or bent end of wire 17 projecting downwardly into cavity 24. Bracket 17 is placed upon the upper surface of circuit board 10 and clamped by any convenient means if its inherent weight is insufficient to form the necessary airtight seal between the surface adjacent opening 23 and circuit board 10 itself. If only a single wire segment 17, as shown in FIG. 1 is to be removed, a heated soldering iron is applied to its upper projecting end and the solder 25 surrounding it. If a component is attached to wire segment 17 (FIG. 2) each wire segment 17 must have its surrounding solder 25 melted simultaneously. When the solder is completely molten, valve 13 must be opened wide. Air contained within cavity 24 rushes from the cavity through valve 13 and its connecting hoses 20 and 21 into vacuum source 14. Although the atmospheric force placed on each lead 17 is very small, on the order of .2 ounce, many hours of actual usage have indicated that this is a sufficient force to expell lead 17 from its original hole. As lead 17 is sucked from hole 22, the molten solder 25 in the hole is forced out as well, leaving the board in condition for replacement of a removed lead 17 or component 18.

Furthermore, experience has shown that up to 50 three-lead transistors can be removed from a single board without degrading the performance of the apparatus.

Figure 2:
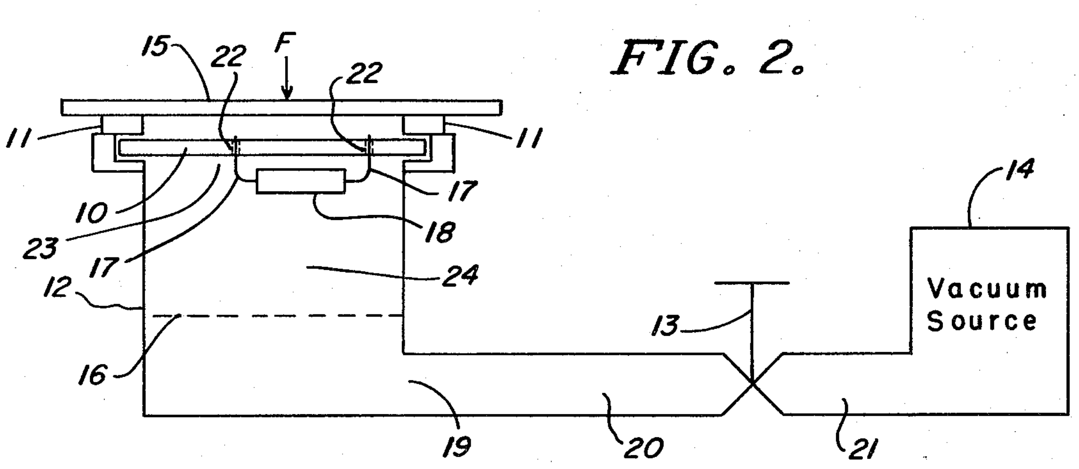
FIG. 2 displays the apparatus of the invention employing a second embodiment of the seal between the circuit board and the cavity within the vessel.

FIG. 2 displays a slightly different variation of the apparatus in FIG. 1. A representative component 18 is shown in its position in board 10 prior to removal. Seal or gasket 11 is shown in a position contacting both the upper surface of circuit board 10 and an annular surface of vessel 12 surrounding opening 23. Bracket or collar 15 again has a central open area to enable access to soldered-in leads 17 by the heat sources. The arrow labelled F again generally indicates some type of clamping force compressing seal 11 sufficiently to render it substantially airtight with respect to its contact surfaces on vessel 12 and circuit board 10. Screen 16 is placed in the bottom of chamber 24 to catch each component as it falls during removal, and prevent its being inadvertently sucked through vacuum inlet 19. Screen 16 is preferably chosen to have apertures small enough to catch most of the small solder droplets formed from the molten solder drawn from lead holes 22. Operation is identical to that of the apparatus displayed in FIG. 1.

Experience has shown that an ideal vacuum source 14 is capable of generating a large volume of "vacuum" at approximately a 5 psi or greater pressure difference from atmospheric. Greater vacuum may place stresses on circuit board 10 greater than it is capable of withstanding, and substantially lesser pressures will not as effectively remove the components as the preferred pressure. Valve 13 may be of any convenient type, but experience again shows that a foot-operated solenoid valve is most convenient in that it frees both hands for operation of the heat sources.

If several identically located components are to be removed from many different printed circuit boards, it may be preferable to melt the leads of several of the components simultaneously. This may be done by several people simultaneously manipulating heat sources or by a special jig which positions several heat sources to simultaneously melt the solder.

We claim:

1. Apparatus for removing with the assistance of gravity from a printed circuit board, a component positioned beneath the printed circuit board and whose leads extend upwardly through holes in the printed circuit board filled with molten solder, comprising:

a. a vessel having a cavity with a vacuum inlet, and an upwardly facing opening in the cavity shaped to enclose the area of the printed circuit board containing the component and its leads with the component facing downwardly;

b. means for forming a substantially airtight seal between the vessel opening and the printed circuit board;

c. a source of vacuum; and d. means for connecting and disconnecting the vacuum source to the vacuum inlet for causing withdrawal of the component and at least some of the molten solder from the holes by the combined force of gravity and an applied vacuum.

2. The apparatus of claim 1 wherein the vacuum source provides at least approximately 5 pounds per square inch of vacuum.

3. The apparatus of claim 1 wherein the seal-forming means comprises a resilient gasket strip interposed between the printed circuit board and the vessel, and surronding both the component to be removed when the board is positioned across the opening, and the opening; and means for passing the board toward the cavity.

4. The apparatus of claim 1 wherein the seal-forming means comprises a resilient gasket contacting both the printed circuit board around its entire periphery when the board is positioned across the opening, and the periphery of the opening; and means for compressing the resilient gasket against both the periphery of the opening and the board.

5. The apparatus of claim 4 wherein the vessel contains a depression completely containing the cavity opening and substantially matching the dimensions of the printed circuit board, within which depression the printed circuit board will lie component side down.

6. The apparatus of claim 1 further comprising a porous screen interposed in the cavity between the upwardly facing opening and the vacuum inlet.

7. The apparatus of claim 6 wherein the porous screen comprises a wire mesh screen having apertures smaller than the usual solder drops drawn from the printed circuit board holes during operation of the apparatus.

* * * * *

UNITED STATES PATENT OFFICE
CERTIFICATE OF CORRECTION

Patent No. 3,834,605 Dated October 24, 1974

Inventor(s) Harry S. Coffin

It is certified that error appears in the above-identified patent and that said Letters Patent are hereby corrected as shown below:

For the Assignee "Control Valve Corporation," change to read as --Control Data Corporation,--

In Column 4, line 19, "We" should read --I--

Signed and sealed this 31st day of December 1974.

(SEAL)
Attest:

McCOY M. GIBSON JR.
Attesting Officer

C. MARSHALL DANN
Commissioner of Patents

ORM PO-1050 (10-69)

USCOMM-DC 60376-P69
★ U.S. GOVERNMENT PRINTING OFFICE : 1969 O—366-334.